(12) United States Patent
Mizoguchi

(10) Patent No.: US 9,186,908 B2
(45) Date of Patent: Nov. 17, 2015

(54) ACTUATOR, OPTICAL SCANNER, AND IMAGE FORMING APPARATUS

(75) Inventor: Yasushi Mizoguchi, Suwa (JP)

(73) Assignee: Seiko Epson Corporation (JP)

(*) Notice: Subject to any disclaimer, the term of this patent is extended or adjusted under 35 U.S.C. 154(b) by 226 days.

(21) Appl. No.: 13/311,628

(22) Filed: Dec. 6, 2011

(65) Prior Publication Data

US 2012/0147445 A1    Jun. 14, 2012

(30) Foreign Application Priority Data

Dec. 8, 2010  (JP) ................ 2010-273257

(51) Int. Cl.
*G02B 26/10* (2006.01)
*B41J 2/47* (2006.01)
*B81B 3/00* (2006.01)
*G02B 26/08* (2006.01)

(52) U.S. Cl.
CPC .............. *B41J 2/471* (2013.01); *B81B 3/0062* (2013.01); *G02B 26/085* (2013.01); *G02B 26/105* (2013.01); *B81B 2201/042* (2013.01)

(58) Field of Classification Search
CPC ............ G02B 26/0833–26/0866; B81B 3/0035–3/0048; B81B 3/0062; B81B 3/0064–3/0078; B81B 3/0083; B81B 2201/03; B81B 7/02; B81B 2201/04–2201/047
USPC ......... 359/198.1–199.4, 200.6–200.8, 202.1, 359/221.2, 223.1–225.1, 226.2, 904, 359/290–295, 838, 846, 871, 872, 212.1; 250/204, 559.06, 559.29, 230, 234; 347/255–260; 353/39, 98–99; 385/15–18, 22; 398/12, 19, 45

See application file for complete search history.

(56) References Cited

U.S. PATENT DOCUMENTS 6,480,320 B2 * 11/2002 Nasiri ........................ 359/291
7,170,665 B2 *  1/2007 Kaneko et al. ............. 359/290

FOREIGN PATENT DOCUMENTS

| JP | 08-322227 | 12/1996 |
| JP | 2002-539496 A | 11/2002 |
| JP | 2004-237400 A | 8/2004 |
| JP | 2005-181395 | 7/2005 |
| WO | WO-00-55666 A1 | 9/2000 |
| WO | WO-02-04991 A2 | 1/2002 |

* cited by examiner

*Primary Examiner* — Stephone B Allen
*Assistant Examiner* — James McGee
(74) *Attorney, Agent, or Firm* — Harness, Dickey & Pierce, P.L.C.

(57) ABSTRACT

An actuator includes a movable member which rotates around a rotation axis, a plurality of connecting members which extend from the movable member through a shaft and are disposed in the vicinity of the outer circumference of the movable member at equal intervals in the plan view as viewed in a thickness direction of the movable member, and a support unit which supports each of the plurality of connecting members. Each of the plurality of connecting members has a driving portion rotatably connected with the support unit, and the shaft connecting the movable member and the driving portion. A first connecting portion that connects the movable member with the shaft and that is disposed opposite to a corresponding second connecting portion that connects the driving portion with the shaft through the movable member so that the movable member is interposed between the first connecting portion and the second connecting portion.

28 Claims, 8 Drawing Sheets

ACTUATOR, OPTICAL SCANNER, AND IMAGE FORMING APPARATUS

The entire disclosure of Japanese Patent Application No. 2010-273257, filed Dec. 8, 2010, is expressly incorporated by reference herein.

BACKGROUND

1. Technical Field

The present invention relates to an actuator, an optical scanner, and an image forming apparatus.

2. Related Art

It is known that an actuator configured with a torsional oscillator is used as, for example, an optical scanner for a laser printer producing images by optical beam scanning. For example, Japanese laid-open patent application number 2005-181395 (JP-A-2005-181395) discloses one such actuator.

The actuator disclosed in JP-A-2005-181395 contains a frame-shaped support board, a flat-plate-shaped mirror (reflection mirror) disposed inside the support board, and a linear bar-shaped torsion bar connecting the support board and the mirror. According to this structure, the mirror rotates in accordance with the twisting of the torsion bar. Optical beam scanning can be performed by the rotation of the mirror. This type of actuator has been developed as a compact device, but to the contrary, the size of the mirror included in the actuator is increasing.

According to the actuator disclosed in JP-A-2005-181395, assuming that the size of the actuator does not change in a plan view, the length of the torsion bar decreases as the area (diameter) of the mirror increases. In this case, the torsion bar does not easily twist and therefore it is difficult to produce sufficient rotation of the mirror for the light beam scanning.

SUMMARY

An advantage of some aspects of the invention is to provide an actuator, an optical scanner, and an image forming apparatus capable of achieving size reduction and rotation of a movable plate in a stable condition by the largest possible amount.

An aspect of the invention is directed to an actuator including: a movable plate which has light reflectivity; a support unit which supports the movable plate at a position in the vicinity of the outer circumference of the movable plate; and three or four connecting members that connect the movable plate with the support unit and are disposed in the vicinity of the outer circumference of the movable plate at equal intervals in the circumferential direction of the movable plate in the plan view of the movable plate. Each of the connecting members has a driving portion disposed away from the movable plate and rotatable with respect to the support unit, and an elongated shaft which connects the movable plate with the driving portion. One end of the shaft corresponds to a movable plate side connecting point connected with the movable plate, while the other end of the shaft corresponds to a driving portion side connecting point connected with the driving portion, the movable plate side connecting point being disposed opposite to the driving portion side connecting point through the movable plate so that the movable plate is interposed between the movable plate side connecting point and the driving portion side connecting point.

According to this structure, the actuator becomes compact and can rotate the movable plate by the largest possible amount in a stable condition.

It is preferable that the shaft of the actuator according to the aspect of the invention has at least one bending point in which the shaft is bent or curved at an intermediate portion of the shaft in a longitudinal direction of the shaft.

According to this structure, the entire length of the shaft becomes the largest possible length even when the size of the actuator is the same as the size of the related-art actuator. Thus, the movable plate can be easily rotated, and the rotation angle can be enlarged.

It is preferable that the movable plate of the actuator according to the aspect of the invention has a circular shape in the plan view, and that the bending point includes a portion bent in such a direction as to follow the curve of the circumference of the circular shape.

According to this structure, the entire length of the shaft becomes the largest possible length even when the size of the actuator is the same as the size of the related-art actuator. Thus, the movable plate can be easily rotated, and the rotation angle can be enlarged.

It is preferable that the shaft of the actuator according to the aspect of the invention has a stress relieving portion disposed at a position different from the bending point at the intermediate portion of the shaft in the longitudinal direction of the shaft to provide a function of relieving stress.

According to this structure, stress can be securely relieved by the stress relieving portion. Thus, a sufficient rotation angle of the movable plate can be securely obtained.

It is preferable that the stress relieving portion of the actuator according to the aspect of the invention is thinner than an area of the shaft other than the stress relieving portion.

According to this structure, stress acting on the shaft can be securely relieved by the stress relieving portion. Thus, a sufficient rotation angle of the movable plate can be securely obtained.

It is preferable that the stress relieving portion of the actuator according to the aspect of the invention has a part extending in a zigzag shape.

According to this structure, the rotation angle of the rotated movable plate does not decrease.

It is preferable that the stress relieving portion of the actuator according to the aspect of the invention is disposed close to the movable plate side connecting point.

According to this structure, stress can be securely relieved by the stress relieving portion. Thus, a sufficient rotation angle of the movable plate can be securely obtained.

It is preferable that a plurality of the bending points are provided on the actuator according to the aspect of the invention, and that the stress relieving portion is disposed at a position between the movable plate side connecting point and one of the plurality of bending points located closest to the movable plate side connecting point.

According to this structure, stress can be securely relieved by the stress relieving portion. Thus, a sufficient rotation angle of the movable plate can be securely obtained.

It is preferable that the movable plate of the actuator according to the aspect of the invention has a circular shape in the plan view, and that the center point of the circular shape is located on a line connecting the movable plate side connecting point and the driving portion side connecting point in the plan view of the movable plate.

According to this structure, the entire length of the shaft becomes the largest possible length even when the size of the actuator is the same as the size of the related-art actuator. Thus, the movable plate can be rotated by the largest possible amount.

It is preferable that the movable plate of the actuator according to the aspect of the invention has a circular shape in the plan view, and that the center point of the circular shape is located away from a line connecting the movable plate side connecting point and the driving portion side connecting point in the plan view of the movable plate.

This structure is advantageous when the number of bending points formed on the intermediate portion of the shaft in its longitudinal direction as bent or curved points is desired to be decreased.

It is preferable that the actuator according to the aspect of the invention further includes a displacement unit that displaces the movable plate with respect to the support unit. In this case, the displacement unit has a permanent magnet provided on the driving portion of each of the plurality of connecting members, and a coil generating magnetic field acting on the permanent magnet.

According to this structure, the structure of the displacement units can be simplified. Moreover, the displacement units can generate relatively large forces sufficient for rotating the movable plate.

It is preferable that the permanent magnet of the actuator according to the aspect of the invention is provided in such a position that each of poles of the permanent magnet is located opposite to each other in the thickness direction of the movable plate, and that the coil is provided in such a condition as to generate magnetic field in the direction perpendicular to the thickness direction of the movable plate.

According to this structure, magnetic field can be easily generated.

It is preferable that the movable plate of the actuator according to the aspect of the invention independently rotates around an X axis and a Y axis as two axes of the movable plate perpendicular to each other in the plan view by forces transmitted via the plurality of connecting members when the displacement unit is operated.

According to this structure, the movable plate can be rotated in a stable condition by the largest possible amount.

It is preferable that the support unit of the actuator according to the aspect of the invention is a frame-shaped wall surrounding the movable plate.

According to this structure, the movable plate can be supported in a stable condition.

It is preferable that the wall of the actuator according to the aspect of the invention has the same number of cutouts as the number of the plurality of connecting members to provide cutout portions of the wall, and the driving portion is disposed at each of the cutouts with one-to-one correspondence.

According to this structure, the areas at which the driving portions are disposed are formed by the support unit, which contributes to size reduction of the actuator.

Another aspect of the invention is directed to an optical scanner including a movable plate which has light reflectivity, a support unit which supports the movable plate at a position in the vicinity of the outer circumference of the movable plate, and three or four connecting members that connects the movable plate with the support unit and that is disposed in the vicinity of the outer circumference of the movable plate at equal intervals in the circumferential direction of the movable plate in the plan view of the movable plate. Each of the connecting members has a driving portion disposed away from the movable plate and rotatable with respect to the support unit, and an elongated shaft which connects the movable plate with the driving portion. One end of the shaft corresponds to a movable plate side connecting point connected with the movable plate, while the other end of the shafts corresponds to a driving portion side connecting point connected with the driving portion, the movable plate side connecting point being disposed opposite to the driving portion side connecting point through the movable plate so that the movable plate is interposed between the movable plate side connecting point and the driving portion side connecting point.

According to this structure, the optical scanner becomes compact, and can rotate the movable plate in a stable condition by the largest possible amount.

Still another aspect of the invention is directed to an image forming apparatus including a light emitting unit which emits light, and an optical scanner which reflects the light received from the light emitting unit to perform light scanning. The optical scanner includes a movable plate which has light reflectivity and reflects the light received from the light emitting unit, a support unit which supports the movable plate at a position in the vicinity of the outer circumference of the movable plate, and three or four connecting members that connect the movable plate with the support unit and that are disposed in the vicinity of the outer circumference of the movable plate at equal intervals in the circumferential direction of the movable plate in the plan view of the movable plate. Each of the connecting members has a driving portion disposed away from the movable plate and rotatable with respect to the support unit, and an elongated shaft which connects the movable plate with the driving portion. One end of the shaft corresponds to a movable plate side connecting point connected with the movable plate, while the other end of the shafts corresponds to a driving portion side connecting point connected with the driving portion, the movable plate side connecting point being disposed opposite to the driving portion side connecting point through the movable plate so that the movable plate is interposed between the movable plate side connecting point and the driving portion side connecting point.

According to this structure, the image forming apparatus becomes compact, and can rotate the movable plate in a stable condition by the largest possible amount.

BRIEF DESCRIPTION OF THE DRAWINGS

The invention will be described with reference to the accompanying drawings, wherein like numbers reference like elements.

DESCRIPTION OF EXEMPLARY EMBODIMENTS

An actuator, an optical scanner, and an image forming apparatus according to preferred embodiments of the invention are hereinafter described in detail with reference to the accompanying drawings.

First Embodiment

An optical scanner including an actuator according to a first embodiment of the invention is now explained.

Figure 1:
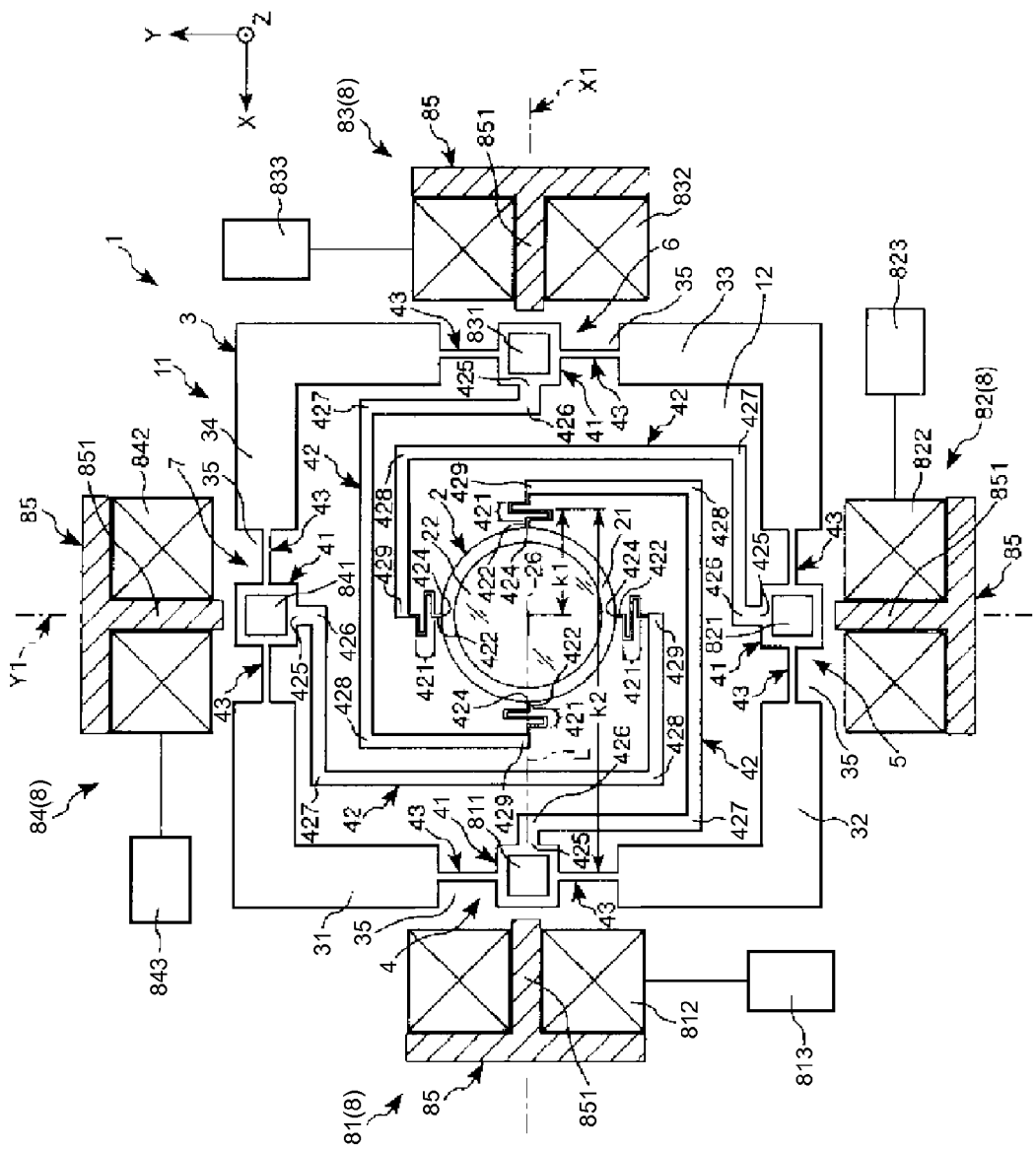
FIG. 1 is a plan view illustrating an optical scanner (actuator) according to a first embodiment of the invention.
Figure 2:
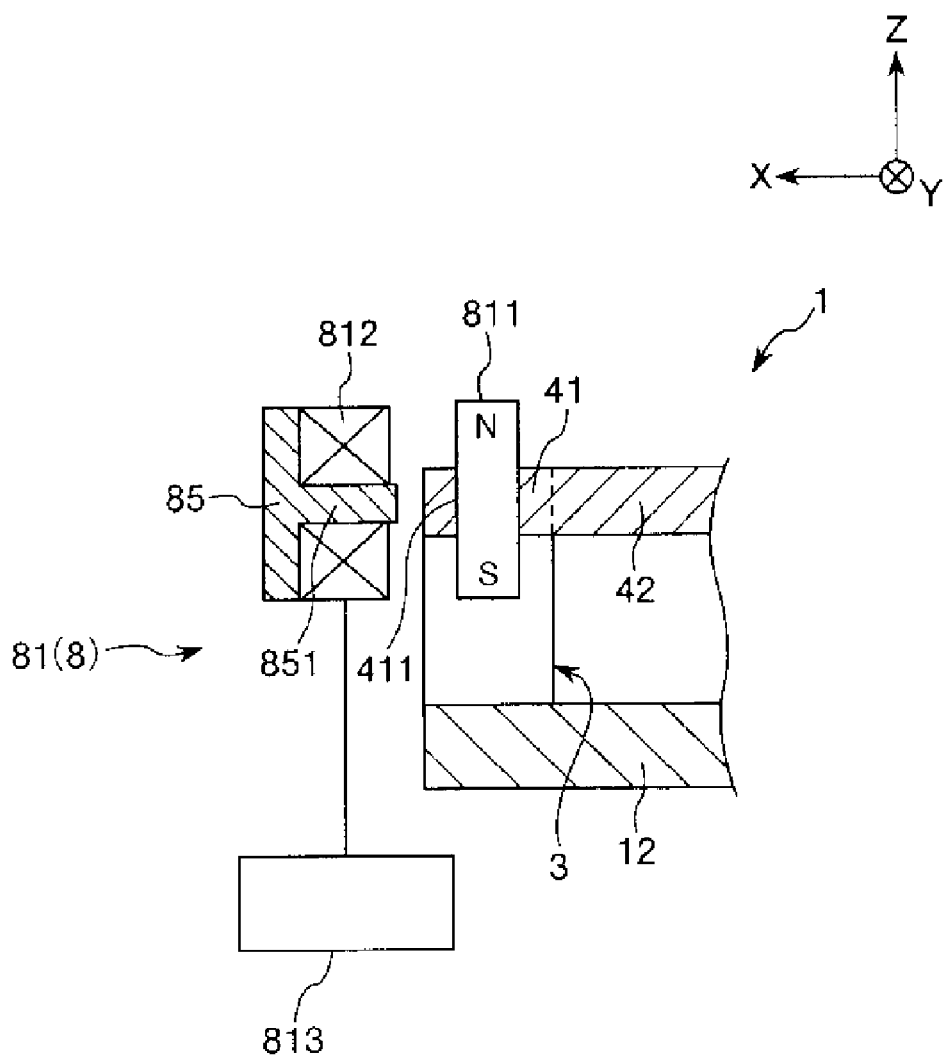
FIG. 2 is a cross-sectional view illustrating a structure example of a displacement unit included in the optical scanner shown in FIG. 1.
Figure 3:
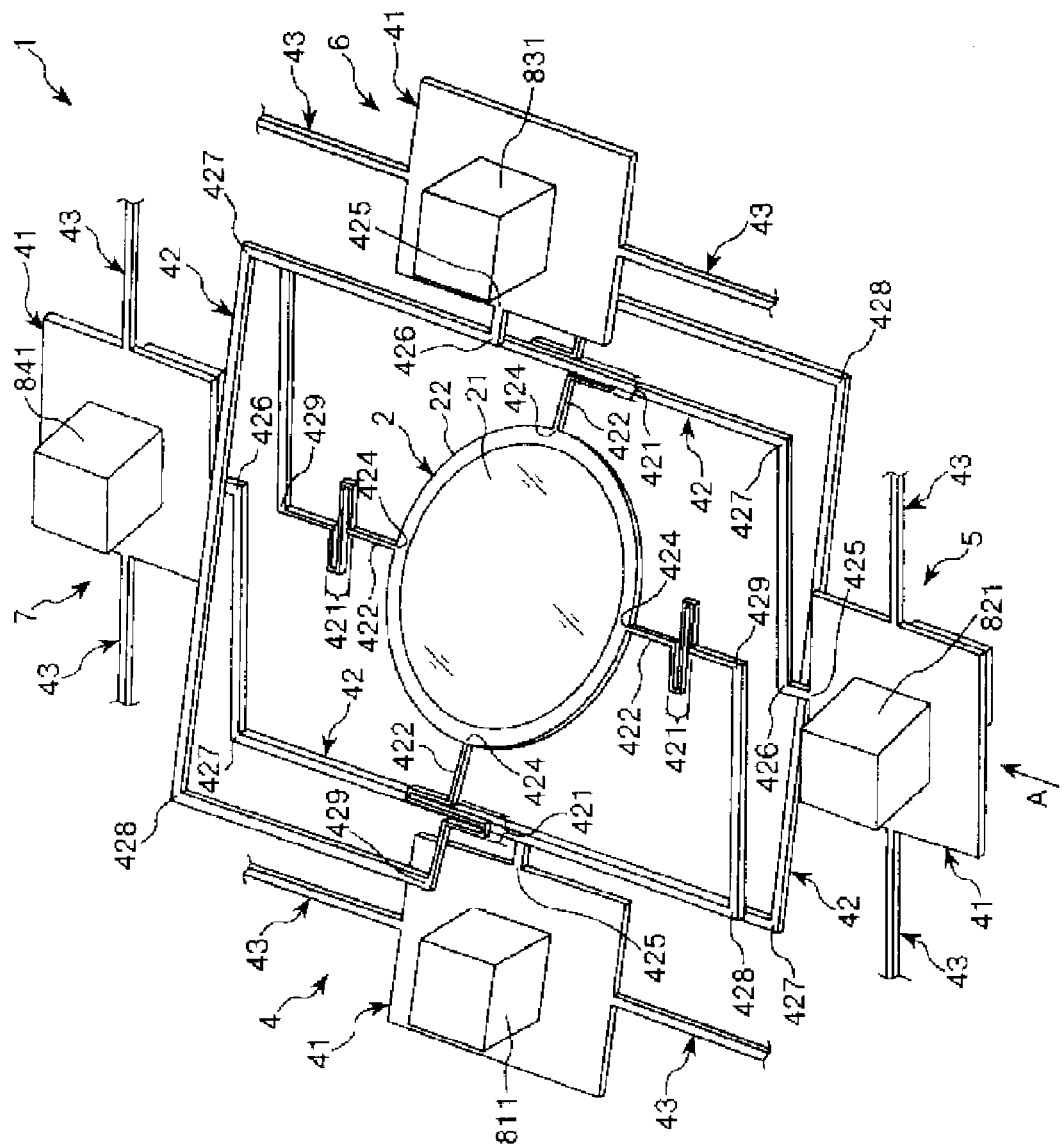
FIG. 3 is a perspective view illustrating a driving condition of the optical scanner shown in FIG. 1.
Figure 4:
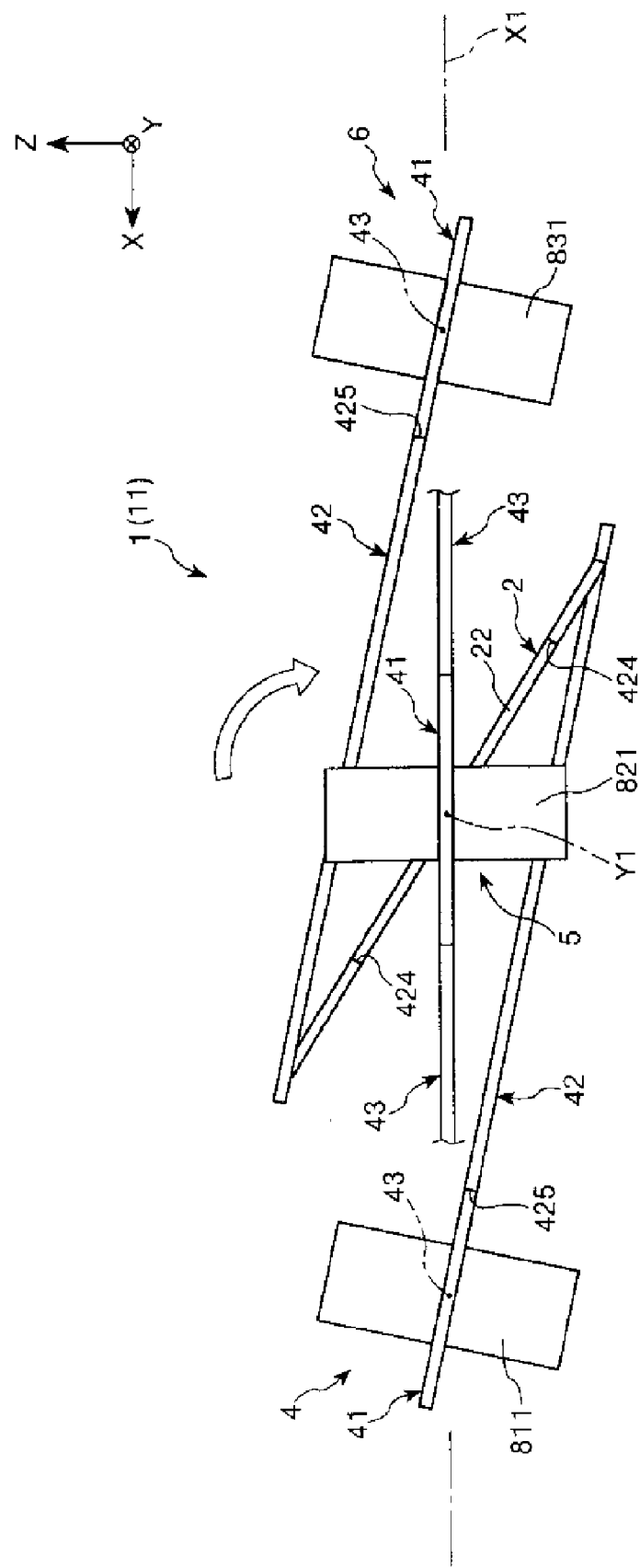
FIG. 4 illustrates a condition as viewed in a direction indicated by an arrow A in FIG. 3.

FIG. 1 is a plan view illustrating the optical scanner (actuator) according to the first embodiment of the invention. FIG. 2 is a cross-sectional view illustrating a structure example of a displacement unit (displacement producing unit) included in the optical scanner shown in FIG. 1. FIG. 3 is a perspective view illustrating a driving condition of the optical scanner shown in FIG. 1. FIG. 4 illustrates a condition as viewed in a direction of an arrow A in FIG. 3. In the following description, the upward and downward directions are determined as viewed in FIGS. 2 and 4 for convenience of explanation. Two axes crossing each other at a right angle in the plan view of the optical scanner (movable plate) are referred to as an "X axis and a "Y axis". A further axis crossing the X axis and the Y axis at a right angle is referred to as a "Z axis".

An optical scanner 1 shown in FIGS. 1 and 2 includes a movable plate (movable member) 2, a support unit 3 which supports the movable plate 2, an oscillation system 11 which has four connecting members 4, 5, 6, and 7 for connecting the movable plate 2 and the support unit 3, a base table 12 which supports the oscillation system 11, and a displacement unit (displacement producing unit) 8 which displaces or shifts the movable plate 2 with respect to the support unit 3. The respective components of the optical scanner 1 are now explained.

According to this embodiment, the oscillation system 11, more specifically, the movable plate 2, the support unit 3, and the four connecting members 4, 5, 6, and 7 are formed integrally with each other by removing an unnecessary portion of an SOI board through dry etching, wet etching, or other etching methods.

The support unit 3 is disposed outside the circumference of the movable plate 2 to support the movable plate 2. As illustrated in FIG. 1, the support unit 3 has a frame shape, that is, a square shape in the plan view, and has walls disposed in such a condition as to surround the periphery of the movable plate 2. The support unit 3 having this configuration can support the movable plate 2 in a stable condition.

Each of walls 31, 32, 33, and 34 corresponding to each side of the square shape has a cutout 35 at the center of the side in the longitudinal direction of the corresponding wall. The same number of the cutouts 35 as that of the connecting members 4, 5, 6, and 7 are provided so that the connecting members 4, 5, 6, and 7 can be disposed at the cutouts 35 with one-to-one correspondence.

The movable plate 2 is provided inside the support unit 3. The movable plate 2 has a flat plate shape, and includes a light reflection portion 22 on an upper surface 21 (surface on the side opposite to the base table 12). The light reflection portion 22 has light reflectivity. The light reflection portion 22 is produced by depositing a metal film such as gold, silver, and aluminum on the upper surface 21.

While the shape of the movable plate 2 in this embodiment is circular in the plan view, this shape may be a polygonal shape such as rectangular and square shapes, or an elliptic shape.

The connecting members 4, 5, 6, and 7 are disposed outside the circumference of the movable plate 2. Each of the connecting members 4, 5, 6, and 7 has a driving portion 41, a first shaft (shaft) 42 connecting the driving portion 41 and the movable plate 2, and a pair of second shafts 43 connecting the driving portion 41 and the support unit 3. The details of the connecting members 4, 5, 6, and 7 will be described later.

As illustrated in FIG. 1, the displacement unit 8 includes a first displacement unit 81 which has a permanent magnet 811, a coil 812, and a power source 813, a second displacement unit 82 which has a permanent magnet 821, a coil 822, and a power source 823, a third displacement unit 83 which has a permanent magnet 831, a coil 832, and a power source 833, and a fourth displacement unit 84 which has a permanent magnet 841, a coil 842, and a power source 843.

The first displacement unit 81 is provided as a unit associated with the connecting member 4. The second displacement unit 82 is provided as a unit associated with the connecting member 5. The third displacement unit 83 is provided as a unit associated with the connecting member 6. The fourth displacement unit 84 is provided as a unit associated with the connecting member 7.

According to this structure, the above configuration of the displacement unit 8 becomes simple. Moreover, the displacement unit 8 driven electromagnetically produces relatively large force and thus securely rotates the movable plate 2. Furthermore, the displacement units 8 provided for the connecting members 4, 5, 6, and 7 with one-to-one correspondence can separately deform the respective connecting members 4, 5, 6, and 7. This structure allows the movable plate 2 to rotate independently around a rotation axis X1 and a rotation axis Y1.

The first displacement unit 81, the second displacement unit 82, the third displacement unit 83, and the fourth displacement unit 84 are now explained. The structure of the first displacement unit 81 specifically described herein as an example applies equally to the displacement units 82 through 84.

As illustrated in FIG. 2, the permanent magnet 811 is bar-shaped and magnetized in its longitudinal direction. Thus, one end of the permanent magnet 811 in the longitudinal direction (lower part in the figure) corresponds to the S-pole, while the other end (upper part in the figure) corresponds to the N-pole. The permanent magnet 811 having this structure is inserted into a through hole 411 formed on the driving portion 41 such that substantially the center of the permanent magnet 811 in its longitudinal direction can be fixed to the driving portion 41. According to this structure, the same length of the permanent magnet 811 projects from the driving portion 41 in upward and downward directions. The S-pole and the N-pole are opposed to each other with the driving unit 41 interposed therebetween. That is, in the thickness direction of the movable plate 2. The longitudinal direction of the permanent magnet 811 is determined perpendicular to a planer direction of the driving unit 41. The center axis of the permanent magnet 811 is disposed in such a direction as to cross the first shaft 42. The position of the permanent magnet 811 in these conditions contributes to stable displacement of the movable plate 2.

The material of the permanent magnet 811 is not specifically limited but may be any types of magnet. Preferable examples of the material of the permanent magnet 811 are neodymium magnet, ferrite magnet, samarium-cobalt magnet, Al—Ni—Co magnet, bonded magnet, and other materials magnetized by hard magnetic substances.

While the permanent magnet 811 has a bar shape in this embodiment, the permanent magnet 811 may be plate-shaped.

The coil 812 generates magnetic field acting on the permanent magnet 811. The coil 812 having this function is disposed in the vicinity of the outside of the oscillation system 11 at a position opposite to the permanent magnet 811 in the X-axis direction. The coil 812 is provided in such a condition as to generate the magnetic field in the X-axis direction (direction perpendicular to the thickness direction of the movable plate 2). That is, in such a condition as to produce a state where the permanent magnet 811 side and the opposite side of the coil 812 become the N-pole and the S-pole, respectively, and where the permanent magnet 811 side and the opposite side of the coil 812 become the S-pole and the N-pole, respectively.

The optical scanner 1 in this embodiment has a coil fixing portion 85 disposed outside the oscillation system 11 and fixed to the base table 12. The coil 812 is wound around a projection 851 extended in the X direction from the coil fixing portion 85. This structure allows the coil 812 to be fixed to the oscillation system 11, and to easily generate magnetic field described above. When the projection 851 is made of soft magnetic material such as iron, the projection 851 can be used as a core of the coil 812. In this case, the above-mentioned magnetic field can be more efficiently generated.

The power source 813 is electrically connected with the coil 812. When a desired voltage is applied to the coil 812 from the power source 813, the above-noted magnetic field is generated from the coil 812. According to this embodiment, the power source 813 can selectively apply alternating voltage or direct current voltage. When alternating voltage is applied, its intensity and frequency can be varied. Moreover, offset voltage (direct current voltage) can be superposed on the alternating voltage.

As illustrated in FIG. 2, the base table 12 is a flat-plate-shaped component. The base table 12 is joined to the lower surface of the support unit 3. The method employed for this connection is not specifically limited. For example, the base table 12 and the support unit 3 may be joined by using an adhesive, or by anode junction or other junction methods. It is preferable that the base table 12 is made of glass or silicon as a main material.

As noted above, the connecting members 4, 5, 6, and 7 are provided outside the circumference of the movable plate 2. The connecting members 4, 5, 6, and 7 are disposed at equal intervals in the circumferential direction of the outer circumference of the movable plate 2, that is, at equal angle intervals around a center point 26 of the circular movable plate 2. In other words, the connecting members 4 and 6 of the four connecting members 4, 5, 6, and 7 are disposed point-symmetrically with respect to the center point 26 of the movable plate 2, while the connecting members 5 and 7 are disposed point-symmetrically with respect to the center point 26 of the movable plate 2. The structure of the connecting member 4 explained herein as an example equally applies to the other connecting members 5, 6, and 7.

As illustrated in FIG. 1, the driving portion 41 is disposed away from the movable plate 2, and positioned within the cutout 35 as the one included in the four cutouts 35 of the support unit 3 and located on the left side of the figure. According to this structure, the area where the driving unit 41 is disposed is formed by the support unit 3, which contributes to size reduction of the optical scanner 1.

The driving portion 41 is positioned between the two bar-shaped second shafts 43 coaxially disposed. One end of each of the second shafts 43 is connected with the support unit 3, while the other end is connected with the driving portion 41. This structure allows the driving portion 41 to rotate around the second shafts 43 with respect to the support unit 3 (see FIG. 4).

As illustrated in FIGS. 1 through 3, the first shaft 42 is an elongated component connecting the movable plate 2 and the driving portion 41. One end of the first shaft 42 is a movable plate side connecting point 424 (first connecting portion) connected with the movable plate 2, while the other end is a driving portion side connecting point 425 (second connecting portion) connected with the driving portion 41. The first shaft 42 has four bending points 426, 427, 428, and 429 formed in this order from the root side (driving portion 41 side) and bent to produce a hook shape, that is, formed by bending the intermediate portion of the first shaft 42 in the longitudinal direction. The bending point 426 is a portion bent in a clockwise direction in FIG. 1. And the bending points 427 through 429 are portions bent in a counterclockwise direction in FIG. 1 (located outside the circumference of the movable plate 2 and bent in such directions as to follow the curve of the circumference (circumference of the circle) of the movable plate 2).

According to this structure, the movable plate side connecting point 424 is disposed on the side opposite to the driving portion side connecting point 425 through the movable plate 2 so that the movable plate 2 is interposed between the points 424 and 425 by the arrangement of the respective bending points 426 through 429. Moreover, according to this embodiment, the center point 26 of the movable plate 2 (circle) is located on a line L connecting the movable plate side connecting point 424 and the driving portion side connecting point 425 in the plan view as illustrated in FIG. 1. In this structure, the entire length of the first shaft 42 can be enlarged to the largest possible length even when the size of the optical scanner 1 is kept equivalent to the size of the optical scanner in the related art. Therefore, the movable plate 2 can be rotated by the largest possible amount, that is, by a sufficient amount for light scanning when the first shaft 42 is made inclined (displaced) (see FIGS. 3 and 4).

The first shaft 42 has a stress relieving portion 421, and a movable plate side shaft 422 connecting the stress relieving portion 421 and the movable plate 2. The stress relieving portion 421 is disposed at a position different from the bending points 426 through 429 at the intermediate positions of the first shaft 42 in its longitudinal direction. More specifically, the stress relieving portion 421 is disposed between the movable plate side connecting point 424 and the bending point 429 closest to the movable plate side connecting point 424. The stress relieving portion 421 and the movable plate side shaft 422 are thinner than the area of the first shaft 42 other than the stress relieving portion 421.

When the movable plate 2 rotates around the rotation axis Y1 as illustrated in FIG. 4, the respective stress relieving portions 421 close to the connecting member 5 and the connecting member 7 absorb the twisting deformation around the axis Y1, thereby preventing the twisting deformation of the first shafts 42 connected with the corresponding stress relieving portions 421. This structure allows the movable plate 2 to rotate by the largest possible amount.

Moreover, the stress relieving portion 421 functions as a node during bending deformation of the first shaft 42. Furthermore, the stress relieving portion 421 has a function of absorbing a force for rotating the movable plate 2 in the clockwise direction along the plane of the plan view in FIG. 1, which force is produced when the movable plate 2 is pulled by the hook-shaped first shaft 42 during rotation around the Y1 axis, so as to prevent rotation of the movable plate 2 in this direction.

It is preferable that the optical scanner 1 is both compact and provided with the movable plate 2 (light reflection portion 22) having a large size (radius). However, "size decrease in the optical scanner 1" and "size increase in the movable plate 2" are opposite ideas.

When the size of the movable plate 2 increases, a distance k1 between the center point 26 of the movable plate 2 and the center point of the stress relieving portion 421 increases accordingly. According to an optical scanner (actuator) in the related art, the rotation angle of the movable plate 2 decreases as the distance k1 increases, varying in inverse proportion to (inversely with) the distance k1. This is because a distance k2 between each of the second shafts 43 and the center of the stress relieving portion 421 decreases by the same amount as the increase in the distance k1. According to the optical scanner 1 in this embodiment, however, the distance k2 increases in proportion to the increase in the distance k1. Thus, the problem of decrease in the rotation angle of the movable plate 2 can be avoided.

Furthermore, the rotation angle of the movable plate 2 increases by the largest possible amount in a power-saved condition.

The configuration of the stress relieving portion 421 is not specifically limited. It is preferable that the stress relieving portion 421 has a zigzag or meandering shape (zigzag shape). When the stress relieving portion 421 is linear, the rotation angle of the movable plate 2 decreases by the twisting of the first shaft 42. However, when the stress relieving portion 421 has the zigzag shape, the rotation angle of the movable plate 2 does not decrease.

The operation of the optical scanner 1 is now explained.

According to the optical scanner 1 having this structure, a desired mode of the movable plate 2 can be selected from three patterns of rotation, oscillation, and rest at a predetermined position. The optical scanner 1 in this embodiment, therefore, can be driven in various patterns. The rotation of the movable plate 2 around the rotation axis Y1 included in the rotation patterns of the movable plate 2 is now explained as an example with reference to FIGS. 3 and 4.

Initially, alternating voltages are applied to the coils 812 and 832 from the power sources 813 and 833 so that a first condition in which the permanent magnet 811 side of the coil 812 of the first displacement unit 81 and the permanent magnet 831 side of the coil 832 of the third displacement unit 83 become the N-pole and the S-pole, respectively, and a second condition in which the permanent magnet 811 side of the coil 812 and the permanent magnet 831 side of the coil 832 become the S-pole and the N-pole, respectively, can be switched alternately and periodically. It is preferable that the alternating voltages applied to the coils 812 and 832 from the power sources 813 and 833 have the same waveform (the same intensity and frequency).

Under the first condition shown in FIGS. 3 and 4, the S-pole of the permanent magnet 811 is attracted to the coil 812, while the N-pole moves away from the coil 812. As a result, the driving portion 41 of the connecting member 4 rotates around the pair of the second shafts 43 such that the upper surface of the driving portion 41 faces to the movable plate 2 along with the twisting deformation of the second shafts 43. Simultaneously, the N-pole of the permanent magnet 831 is attracted to the coil 832, while the S-pole moves away from the coil 832. Thus, the driving portion 41 of the connecting member 6 rotates around the pair of the second shafts 43 such that the lower surface of the driving portion 41 faces to the movable plate 2 along with the twisting deformation of the second shafts 43. In other words, each of the driving portions 41 of the connecting members 4 and 6 rotates in a clockwise direction as viewed in FIG. 4.

When the driving portion 41 of the connecting member 4 rotates in the clockwise direction as viewed in FIG. 4, the first shaft 42 of the connecting member 4 shifts downward accordingly. On the other hand, when the driving portion 41 of the connecting member 6 rotates in the clockwise direction as viewed in FIG. 4, the first shaft 42 of the connecting member 6 shifts upward accordingly. Thus, the displacement of the respective first shafts 42 can securely transmit the forces produced by the first displacement unit 81 and the third displacement unit 83 to the movable plate 2 via the first shaft 42. Accordingly, the movable plate 2 can rotate in the clockwise direction around the rotation axis Y1 in a stable condition by the largest possible amount.

On the other hand, under the second condition, the operation in the first condition is performed in the opposite way. By this method, the movable plate 2 can rotate in a counterclockwise direction around the rotation axis Y1 in a stable condition and by the largest possible amount similarly to the first condition.

Accordingly, the movable plate 2 can be rotated around the rotation axis Y1 by switching between the first condition and the second condition alternately and periodically.

The rotation of the movable plate 2 around the rotation center axis X1 is executed substantially in the same manner as that of the rotation of the movable plate 2 around the rotation axis Y1. The two modes of the rotation of the movable plate 2 around the rotation axis X1 and around the rotation axis Y1 may be combined.

The frequencies of the alternating voltages applied to the coils 812 and 832 are not specifically limited. These frequencies may be either equivalent to or different from the resonance frequency of the oscillation system including the movable plate 2 and the connecting members 4, 5, 6, and 7. It is preferable, however, that the frequencies of the alternating voltages are different from the resonance frequency. That is, it is preferable that the optical scanner 1 is driven by non-resonant operation. In this case, the optical scanner 1 can be driven in a more stable condition.

Second Embodiment

An optical scanner including an actuator according to a second embodiment of the invention is now described.

Figure 5:
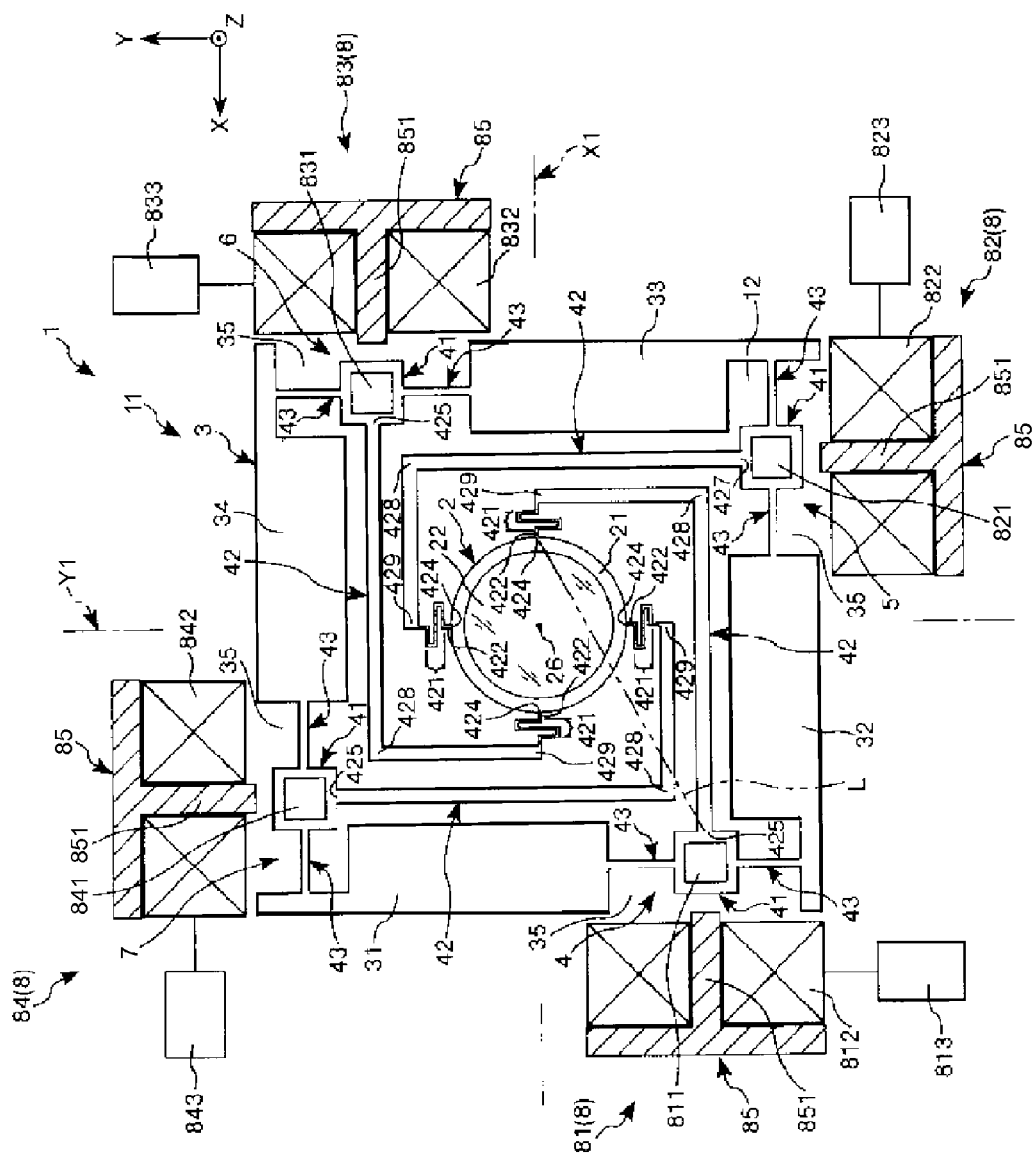
FIG. 5 is a plan view illustrating an optical scanner (actuator) according to a second embodiment of the invention.

FIG. 5 is a plan view illustrating the optical scanner (actuator) in the second embodiment of the invention.

The actuator, the optical scanner, and an image forming apparatus according to the second embodiment are herein explained with reference to this figure. In the following description, the features of the second embodiment different from the first embodiment are mainly discussed, and the same explanation is not repeated.

The structure in this embodiment is similar to that in the first embodiment except that the positional relationships between the center point of the movable plate and the movable plate side connecting point and between the center point of the movable plate and the driving portion side connecting point are different from the corresponding relationships in the first embodiment.

According to the optical scanner 1 in this embodiment shown in FIG. 5, the respective cutouts 35 of the support unit 3 are located at positions shifted from the centers of the walls through 34 in their longitudinal directions. The respective driving portions 41 associated with the connecting members 4 through 7 are disposed at the corresponding cutouts 35 thus provided. According to this structure, the center point 26 of the movable plate 2 is located at a position away from the line L connecting the movable plate side connecting point 424 and the driving portion side connecting point 425 of the connecting member 4 (the same is true for the connecting members 5 through 7).

This structure is advantageous when the bending points of the connecting members 4 through 7 are desired to be decreased.

Third Embodiment

An optical scanner including an actuator according to a third embodiment of the invention is now described.

Figure 6:
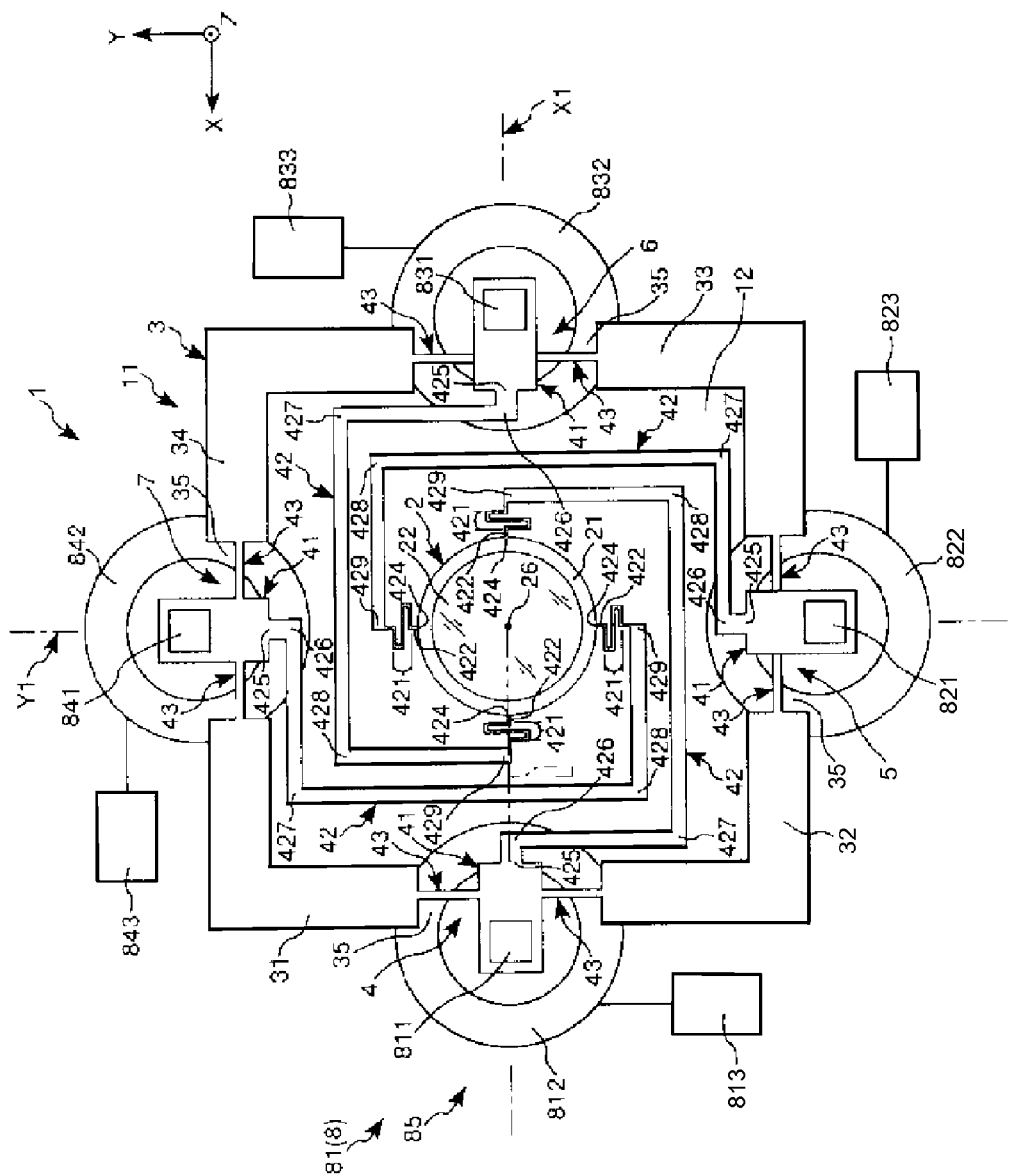
FIG. 6 is a plan view illustrating an optical scanner (actuator) according to a third embodiment of the invention.

FIG. 6 is a plan view illustrating the optical scanner (actuator) in the third embodiment of the invention.

The actuator, the optical scanner, and an image forming apparatus according to the third embodiment are herein explained with reference to this figure. In the following explanation, the features of the third embodiment different from the first and second embodiments are mainly discussed, and the same explanation is not repeated.

The structure of this embodiment is similar to that of the first embodiment except that the positions of the coils of the displacement units are different from the corresponding positions in the first embodiment.

The optical scanner 1 in this embodiment shown in FIG. 6 includes a pair of the coils 812 disposed so as to be opposed to each other in the up-down direction (depth direction from the sheet surface of FIG. 6) with the driving portion 41 of the connecting member 4 interposed between the coils 812, a pair of the coils 822 disposed so as to be opposed to each other in the up-down direction with the driving portion 41 of the connecting member 5 interposed between the coils 822, a pair of the coils 832 disposed so as to be opposed to each other in the up-down direction with the driving portion 41 of the connecting member 6 interposed between the coils 832, and a pair of the coils 842 disposed so as to be opposed to each other in the up-down direction with the driving portion 41 of the connecting member 7 interposed between the coils 842. Each of these coils 812 through 842 can generate magnetic field in the Z-axis direction.

According to the optical scanner 1 having this structure, the respective driving portions 41 can be independently driven similarly to the above embodiments. Thus, the movable plate 2 can be rotated by the largest possible amount.

The optical scanner 1 described above can be incorporated in a projector, a laser printer, an imaging display, a barcode reader, a confocal scanning microscope, or other image forming apparatuses, for example, as a preferable optical scanner for these devices. Therefore, the image forming apparatus provided with the optical scanner 1 has excellent characteristics for image formation.

Figure 7:
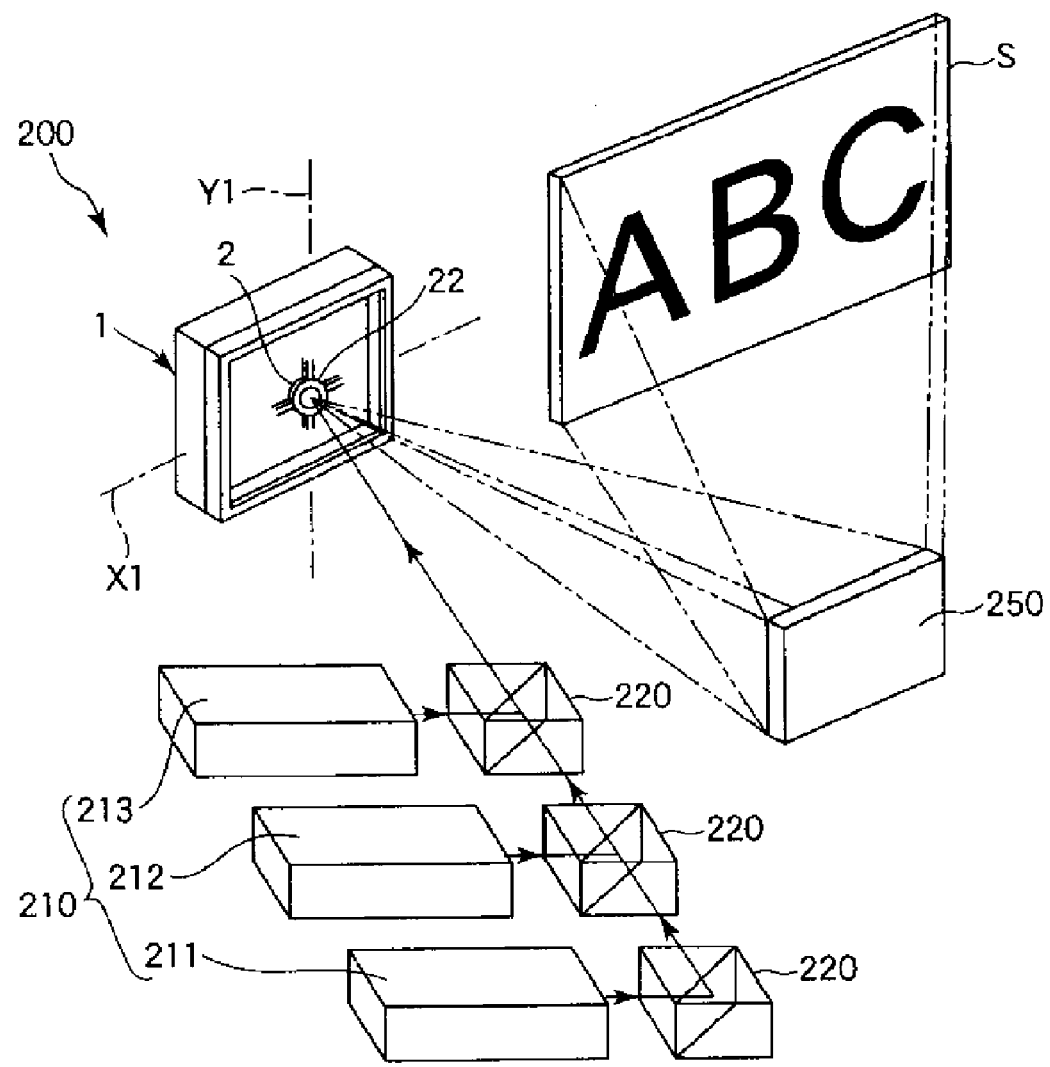
FIG. 7 illustrates the general structure of an image forming apparatus according to an embodiment of the invention.

A projector 200 shown in FIG. 7 as a specific example of the image forming apparatus including the optical scanner 1 is now explained. In the following description, a longitudinal direction of a screen S is referred to as a "horizontal direction", while a direction perpendicular to the longitudinal direction is referred to as a "vertical direction" for convenience of explanation.

The projector 200 includes a light source device 210 provided as a light emitting unit which radiates (emits) light such as laser beams, three dichroic mirrors 220, and the optical scanner 1. According to the projector 200, the optical scanner 1 reflects light received from the light source device 210 to perform light scanning.

The light source device 210 has a red light source device 211 for emitting red light, a blue light source device 212 for emitting blue light, and a green light source device 213 for emitting green light. The dichroic mirrors 220 are optical elements equipped to combine the lights emitted from the red light source device 211, the blue light source device 212, and the green light source device 213.

According to the projector 200 having this structure, the light emitted from the light source devices 210 (red light source device 211, blue light source device 212, and green light source device 213) is combined by the dichroic mirrors 220 based on image information received from a host computer (not shown). The light thus combined is supplied to the optical scanner 1 for two-dimensional scanning so as to form a color image on the screen S.

For two-dimensional scanning, the light reflected by the light reflection portion 22 of the movable plate 2 of the optical scanner 1 by the rotation of the movable plate 2 around the rotation axis Y1 scans in the horizontal direction of the screen S (main scanning). On the other hand, the light reflected by the light reflection portion 22 of the movable plate 2 of the optical scanner 1 by the rotation of the movable plate 2 around the rotation axis X1 scans in the vertical direction of the screen S (sub scanning).

The light scanning by using the optical scanner 1 may be performed either by raster scan corresponding to the method explained above, or by vector scan. It is preferable that the light scanning is conducted by vector scan which is suited for the optical scanner 1 in view of its configuration.

The vector scan is a method for scanning which applies light emitted from the light source device 210 to the screen S in such a manner as to sequentially form segments connecting two different points on the screen S. In other words, this method forms a desired image on the screen S by using a collection of small lines thereon. As noted above, the optical scanner 1 can displace the movable plate 2 irregularly and continuously, and thus is particularly fitted for the vector scan.

Figure 8:
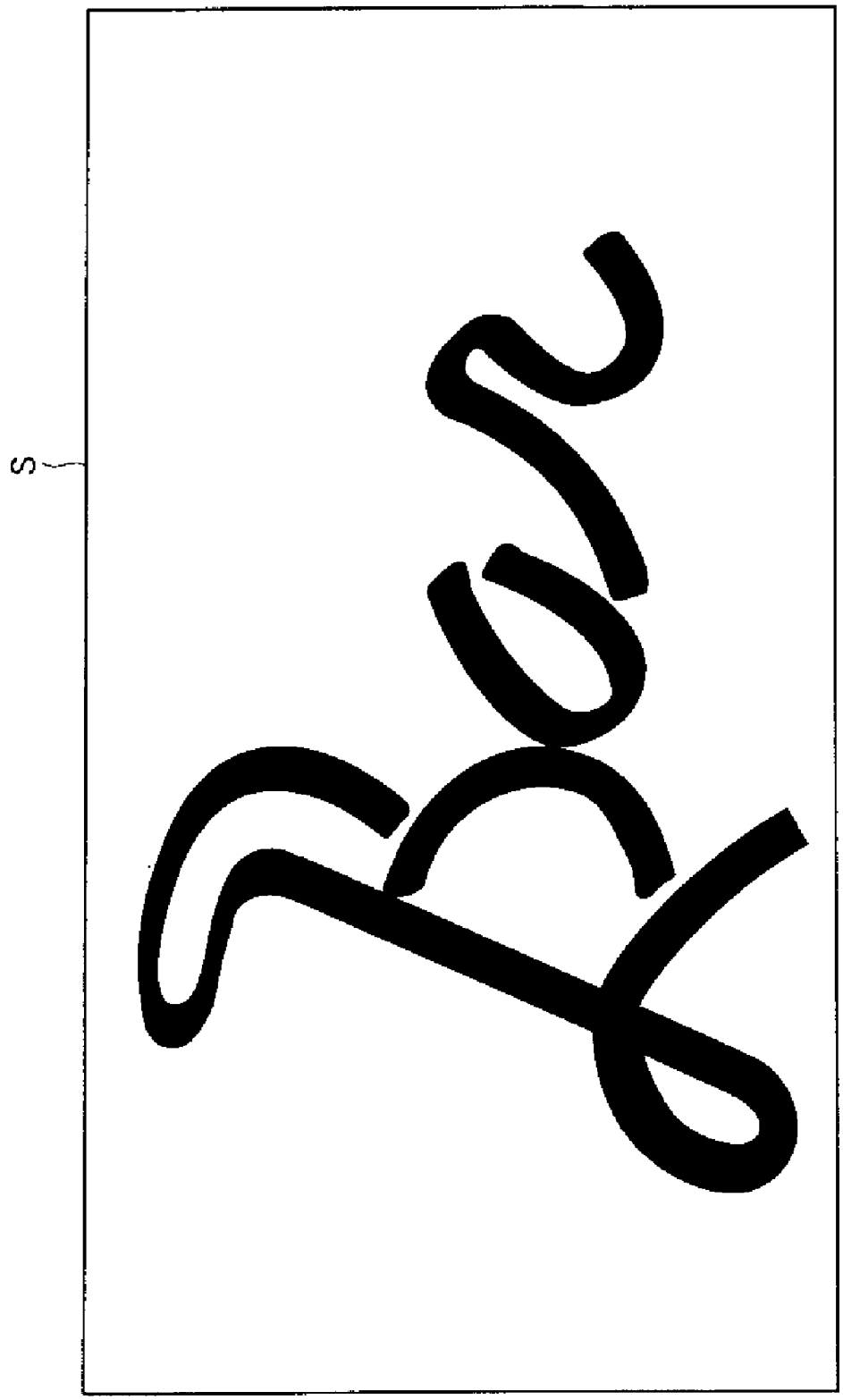
FIG. 8 illustrates an example of an image formed by the image forming apparatus shown in FIG. 7.

More specifically, for forming an image of a collection of characters by vector scan, the light emitted from the light source device 210 is scanned in such a manner as to write the respective characters as shown in FIG. 8. In this case, the light can be scanned irregularly by controlling the position (rotation) of the movable plate 2 of the optical scanner 1 for rotating around the rotation axis X1 and the position (rotation) of the movable plate 2 for rotating around the rotation axis Y1. Thus, the image of the characters shown in FIG. 8 can be formed like an image drawn in one stroke. According to the vector scan performed in this manner, the necessity of light scan on the entire surface of the screen S as required for the raster scan can be eliminated. Thus, the image forming efficiency improves.

According to the structure shown in FIG. 7, two-dimensional scanning of the light combined by the dichroic mirrors 220 is executed by the function of the optical scanner 1, after the light is reflected by a fixed mirror 250 to form an image on the screen S. However, the light supplied for two-dimensional scan from the optical scanner 1 may be directly applied to the screen S by omitting the fixed mirror 250.

The actuator, the optical scanner, and the image forming apparatus according to the invention are not limited to the types described and depicted herein. The parts and components included in the actuator, the optical scanner, and the image forming apparatus in the respective embodiments may be replaced with other parts having arbitrary different structures but providing similar functions. Other additional components and elements may be incorporated as necessary.

The actuator, the optical scanner, and the image forming apparatus according to the invention may have a combination of two or more structures (characteristics) described in the respective embodiments.

While the number of the connecting members connecting the movable plate and the support unit is four in the embodiments, this number may be three.

While the number of the bending points of the first shaft is four in the respective embodiments, this number may be one, two, three, five, or more.

The respective bending points are produced by bending the intermediate part of the first shaft 42 in its longitudinal direction according to the respective embodiments. However, these bending points may be formed as curved portions of the intermediate part of the first shaft 42 in its longitudinal direction. The bent portion and the curved portion may be both provided as the bending points.

The stress relieving portion provided on the first shaft 42 may be eliminated.

According to the respective embodiments, an electromagnetic drive system including the permanent magnet and the electromagnetic coil is employed as the element of the displacement unit. However, other drive systems such as an electrostatic drive system and a piezoelectric drive system may be used as the displacement unit as long as they can displace the movable plate.

What is claimed is:

1. An actuator comprising:
   a movable member which rotates around a rotation axis;
   a plurality of connecting members which extend from the movable member, the plurality of connecting members located near an outer circumference of the movable member at equal intervals in a plan view; and
   a plurality of support units which respectively support the plurality of connecting members, wherein
   each of the plurality of connecting members has
      a first connecting portion that is connected to the movable member;
      a driving portion rotatably connected with one of the plurality of support units, the driving portion is located at a center of the one of the plurality of support units;
      a second connecting portion that is connected to the driving portion and that is spaced apart from the movable member; and
      a shaft that is connected between the first and second connecting portions, the shaft having a stress relieving portion to relieve stress acting on the shaft, the stress relieving portion being thinner than a remainder of the shaft,
   the first connecting portion and a group of the driving portion and the second connecting portion are located opposite to each other with respect to the movable member,
   the first connecting portion, a center of the movable member, the second connecting portion and the driving portion are located on a same linear line, and
   the stress relieving portion relieves the stress acting on the shaft so as to prevent deformation of the shaft during rotation of the movable member.

2. The actuator according to claim 1, wherein the shaft has a bending point at which the shaft starts to bend in a plane perpendicular to a thickness direction of the movable member.

3. The actuator according to claim 2, wherein the stress relieving portion is disposed at a position different from the bending point.

4. The actuator according to claim 3, wherein the stress relieving portion has an elongated part extending in a zigzag shape in a longitudinal direction of the elongated part along the plane perpendicular to the thickness direction of the movable member.

5. The actuator according to claim 3, wherein the stress relieving portion is located at the first connecting portion connected with the movable member.

6. The actuator according to claim 3, wherein the stress relieving portion is disposed between the first connecting portion and the bending point located closest to the first connecting portion.

7. The actuator according to claim 1, wherein the plurality of support units configure a frame surrounding the movable member.

8. The actuator according to claim 7, wherein
   the support unit has the same number of cutouts as the number of the plurality of connecting members to provide cutout portions of the frame shape of the support unit, and
   the driving portion is disposed at each of the cutouts with one-to-one correspondence.

9. The actuator according to claim 1, further comprising:
   a displacement producing unit that rotates the movable member around the rotation axis, wherein
   the displacement producing unit has a permanent magnet provided on the driving portion of each of the plurality of connecting members, and a coil generating a magnetic field acting on the permanent magnet.

10. The actuator according to claim 9, wherein
   the permanent magnet is provided in a position so that each pole of the permanent magnet is located opposite to each other in a thickness direction of the movable member, and
   the coil is adapted to generate the magnetic field in the direction perpendicular to the thickness direction of the movable member.

11. The actuator according to claim 9, wherein
   the rotation axis includes a first rotation axis and a second rotation axis perpendicular to the first rotation axis, and
   the movable member independently rotates around the first rotation axis and the second rotation axis in accordance with the displacement of the driving portion effected by the displacement producing unit.

12. An optical scanner comprising:
   a movable member which contains a light reflection portion having light reflectivity and rotates around a rotation axis;
   a plurality of connecting members which extend from the movable member, the plurality of connecting members located near an outer circumference of the movable member at equal intervals in a plan view; and
   a plurality of support units which respectively support the plurality of connecting members, wherein
   each of the plurality of connecting members has
      a first connecting portion that is connected to the movable member;
      a driving portion rotatably connected with one of the plurality of support units, the driving portion is located at a center of the one of the plurality of support units;
      a second connecting portion that is connected to the driving portion and that is spaced apart from the movable member; and
      a shaft that is connected between the first and second connecting portions, the shaft having a stress relieving portion to relieve stress acting on the shaft, the stress relieving portion being thinner than a remainder of the shaft,
   the first connecting portion and a group of the driving portion and the second connecting portion are located opposite to each other with respect to the movable member,
   the first connecting portion, a center of the movable member, the second connecting portion and the driving portion are located on a same linear line, and
   the stress relieving portion relieves the stress acting on the shaft so as to prevent deformation of the shaft during rotation of the movable member.

13. An image forming apparatus comprising:
   a light emitting unit which emits light; and an optical scanner which reflects the light received from the light emitting unit to perform light scanning, wherein
the optical scanner includes:
  a movable member which contains a light reflection portion having light reflectivity and rotates around a rotation axis;
  a plurality of connecting members which extend from the movable member, the plurality of connecting members located near an outer circumference of the movable member at equal intervals in a plan view; and
  a plurality of support units which respectively support the plurality of connecting members, wherein
each of the plurality of connecting members has
  a first connecting portion that is connected to the movable member;
  a driving portion rotatably connected with one of the plurality of support units, the driving portion is located at a center of the one of the plurality of support units;
  a second connecting portion that is connected to the driving portion and that is spaced apart from the movable member; and
  a shaft that is connected between the first and second connecting portions, the shaft having a stress relieving portion to relieve stress acting on the shaft, the stress relieving portion being thinner than a remainder of the shaft,
the first connecting portion and a group of the driving portion and the second connecting portion are located opposite to each other with respect to the movable member,
the first connecting portion, a center of the movable member, the second connecting portion and the driving portion are located on a same linear line, and
the stress relieving portion relieves the stress acting on the shaft so as to prevent deformation of the shaft during rotation of the movable member.

14. An actuator comprising:
a movable plate which has light reflectivity;
a support unit which supports the movable plate at a position near an outer circumference of the movable plate; and
a plurality of connecting members that connect the movable plate with the support unit and that are disposed near the outer circumference of the movable plate at equal intervals in a circumferential direction of the movable plate in a plan view of the movable plate, wherein
each of the plurality of connecting members has a driving portion disposed away from the movable plate and rotatable with respect to the support unit, and an elongated shaft which connects the movable plate with the driving portion, the shaft having a stress relieving portion to relieve stress acting on the shaft, the stress relieving portion being thinner than a remainder of the shaft,
a first end of the shaft is connected to the movable plate, and a second end of the shaft connected to the driving portion is located at a center of the support unit,
the first end and the second end are located opposite to each other with respect to the movable plate,
the first end, a center of the movable plate and the second end are located on a same linear line, and
the stress relieving portion relieves the stress acting on the shaft so as to prevent deformation of the shaft during rotation of the movable member.

15. The actuator according to claim 14, wherein
the movable plate has a circular shape in the plan view, and a center point of the circular shape is located on a line connecting the first end and the second end in the plan view of the movable plate.

16. The actuator according to claim 14, wherein the shaft has at least one bending point where the shaft is bent at an intermediate portion of the shaft in a longitudinal direction of the shaft.

17. The actuator according to claim 16, wherein
the movable plate has a circular shape in the plan view, and
the bending point includes a portion that is bent in a direction to follow a curve of the circumference of the circular shape.

18. The actuator according to claim 16, wherein the stress relieving portion is disposed at a position different from the bending point.

19. The actuator according to claim 18, wherein the stress relieving portion has a part extending in a zigzag shape.

20. The actuator according to claim 18, wherein the stress relieving portion is disposed next to the first end.

21. The actuator according to claim 18, wherein
a plurality of bending points are provided, and
the stress relieving portion is disposed at a position between the first end and one of the plurality of bending points located closest to the first end.

22. The actuator according to claim 14, wherein the support unit is a frame-shaped wall surrounding the movable plate.

23. The actuator according to claim 22, wherein the wall has the same number of cutouts as the number of the plurality of connecting members to provide cutout portions of the wall, and
the driving portion is disposed at each of the cutouts with a one-to-one correspondence.

24. The actuator according to claim 14, further comprising:
a displacement unit that displaces the movable plate with respect to the support unit, wherein
the displacement unit has a permanent magnet provided on the driving portion of each of the plurality of connecting members, and a coil generating a magnetic field acting on the permanent magnet.

25. The actuator according to claim 24, wherein
the permanent magnet is provided in a position so that each pole of the permanent magnet is located opposite to each other in a thickness direction of the movable plate, and
the coil is adapted to generate the magnetic field in the direction perpendicular to the thickness direction of the movable plate.

26. The actuator according to claim 24, wherein the movable plate independently rotates around an X axis and a Y axis as two axes of the movable plate perpendicular to each other in the plan view by forces transmitted via the plurality of connecting members when the displacement unit is operated.

27. An optical scanner comprising:
a movable plate which has light reflectivity;
a support unit which supports the movable plate at a position near an outer circumference of the movable plate; and
a plurality of connecting members that connects the movable plate with the support unit and that is disposed near the outer circumference of the movable plate at equal intervals in a circumferential direction of the movable plate in a plan view of the movable plate, wherein
each of the plurality of connecting members has a driving portion disposed away from the movable plate and rotatable with respect to the support unit, and an elongated shaft which connects the movable plate with the driving portion, the shaft having a stress relieving portion to relieve stress acting on the shaft, the stress relieving portion being thinner than a remainder of the shaft, a first end of the shaft is connected to the movable plate, and a second end of the shaft connected to the driving portion is located at a center of the support unit, the first end and the second end are located opposite to each other with respect to the movable plate, the first end, a center of the movable plate and the second end are located on a same linear line, and the stress relieving portion relieves the stress acting on the shaft so as to prevent deformation of the shaft during rotation of the movable member.

28. An image forming apparatus comprising:

a light emitting unit which emits light; and an optical scanner which reflects the light received from the light emitting unit to perform light scanning, wherein the optical scanner includes:

- a movable plate which has light reflectivity and reflects the light received from the light emitting unit;
- a support unit which supports the movable plate at a position near an outer circumference of the movable plate, and
- a plurality of connecting members that connect the movable plate with the support unit and that are disposed near the outer circumference of the movable plate at equal intervals in a circumferential direction of the movable plate in a plan view of the movable plate, wherein each of the plurality of connecting members has a driving portion disposed away from the movable plate and rotatable with respect to the support unit, and an elongated shaft which connects the movable plate with the driving portion, the shaft having a stress relieving portion to relieve stress acting on the shaft, the stress relieving portion being thinner than a remainder of the shaft, and a first end of the shaft is connected to the movable plate, and a second end of the shaft connected to the driving portion is located at a center of the support unit, wherein the first end and the second end are located opposite to each other with respect to the movable plate, the first end, a center of the movable plate and the second end are located on a same linear line, and the stress relieving portion relieves the stress acting on the shaft so as to prevent deformation of the shaft during rotation of the movable member.

\* \* \* \* \*